United States Patent
Brosky et al.

(10) Patent No.: US 9,424,937 B2
(45) Date of Patent: Aug. 23, 2016

(54) METHOD FOR PROGRAMMING A FLASH MEMORY

(71) Applicant: U.S. Department of Energy, Washington, DC (US)

(72) Inventors: Alexander R. Brosky, Cranberry Township, PA (US); William N. Locke, Finleyville, PA (US); Conrado M. Maher, Pittsburgh, PA (US)

(73) Assignee: U.S. Department of Energy, Washington, DC (US)

( * ) Notice: Subject to any disclaimer, the term of this patent is extended or adjusted under 35 U.S.C. 154(b) by 115 days.

(21) Appl. No.: 14/187,425

(22) Filed: Feb. 24, 2014

(65) Prior Publication Data

US 2014/0244911 A1     Aug. 28, 2014

Related U.S. Application Data

(60) Provisional application No. 61/768,847, filed on Feb. 25, 2013.

(51) Int. Cl.
*G06F 3/00* (2006.01)
*G11C 16/10* (2006.01)
*G11C 16/22* (2006.01)
*G06F 3/06* (2006.01)
*G06F 13/12* (2006.01)
*G06F 13/38* (2006.01)

(52) U.S. Cl.
CPC .............. *G11C 16/105* (2013.01); *G11C 16/10* (2013.01); *G11C 16/22* (2013.01); *G06F 3/0601* (2013.01); *G06F 13/122* (2013.01); *G06F 13/385* (2013.01)

(58) Field of Classification Search
None
See application file for complete search history.

(56) References Cited

U.S. PATENT DOCUMENTS

| | | | | |
|---|---|---|---|---|
| 4,304,001 A | * | 12/1981 | Cope | G05B 19/0428 340/2.9 |
| 5,436,915 A | * | 7/1995 | Loebig | H04L 1/22 714/797 |
| 6,446,177 B1 | * | 9/2002 | Tanaka | G06F 12/1433 711/103 |
| 2003/0167373 A1 | * | 9/2003 | Winters | G06F 8/665 711/103 |
| 2005/0015671 A1 | * | 1/2005 | Parulkar | G11C 29/16 714/30 |
| 2005/0229004 A1 | * | 10/2005 | Callaghan | G06F 21/33 713/185 |
| 2006/0112266 A1 | * | 5/2006 | Little | G06F 21/51 713/161 |
| 2008/0270677 A1 | * | 10/2008 | Kolakowski | G06F 8/60 711/103 |
| 2010/0250934 A1 | * | 9/2010 | Watanabe | G06F 21/79 713/168 |
| 2012/0151126 A1 | * | 6/2012 | Moore | G06F 1/16 711/103 |
| 2013/0021121 A1 | * | 1/2013 | Uchida | H01H 1/54 335/131 |
| 2013/0159727 A1 | * | 6/2013 | Sarangdhar | G06F 12/1408 713/189 |
| 2014/0025849 A1 | * | 1/2014 | Deborgies | G06F 21/35 710/38 |
| 2014/0095822 A1 | * | 4/2014 | Shiga | G06F 12/1441 711/163 |
| 2015/0052600 A1 | * | 2/2015 | Weinsberg | H04L 12/4641 726/13 |
| 2015/0199190 A1 | * | 7/2015 | Spangler | G06F 8/665 713/2 |

* cited by examiner

*Primary Examiner* — Henry Tsai
*Assistant Examiner* — Aurangzeb Hassan
(74) *Attorney, Agent, or Firm* — Robert T. Burns; John T. Lucas

(57) ABSTRACT

A method of programming a flash memory is described. The method includes partitioning a flash memory into a first group having a first level of write-protection, a second group having a second level of write-protection, and a third group having a third level of write-protection. The write-protection of the second and third groups is disabled using an installation adapter. The third group is programmed using a Software Installation Device.

7 Claims, 7 Drawing Sheets

METHOD FOR PROGRAMMING A FLASH MEMORY

STATEMENT REGARDING FEDERALLY SPONSORED RESEARCH AND DEVELOPMENT

This invention was made with U.S. Government support under N00024-08-C-2103 awarded by the U.S. Department of Energy. The U.S. Government has certain rights in the invention.

BACKGROUND

1. Field

Embodiments discussed herein relate to a method of programming a flash memory.

2. Description of the Related Art

Related embedded computing platforms used removable nonvolatile memory. If the nonvolatile memory required a software upgrade, a new nonvolatile memory device was programmed with the desired upgrade by an outside party and delivered to the end-user; the original memory was removed, and the new device was installed.

As microcircuit technology advanced, more microcircuit components were installed in the same area of the Printed Wiring Board (PWB). As a result, PWB space was at a premium. In order to cope with space limitations, designers started using permanently installed, or "non-removable", components in the PWB. The term "non-removable" refers to memories that are designed to be permanently attached to the PWB. Although referred to as "non-removable," these memories may of course be removed, if necessary. However, the removal process is quite cumbersome as compared to "removable" memories. Using this removal process and the associated reinstallation process in the field in order to upgrade software is not practical. Currently, removable flash memory is no longer commonly used.

Using non-removable flash memory makes software upgrades more difficult. However, a software upgrade process that does not require replacing nonvolatile memory on a PWB can often be performed without removing the PWB from its electrical system. The original software upgrade process with removable nonvolatile memory required removing the PWB from the system in order to replace the nonvolatile memory. Removing a PWB from its electrical system could result in electrical discontinuity. A break in electrical continuity can cause incorrect operation of the system. When a PWB is removed from its electrical system, multiple tests are required to ensure that electrical continuity has been restored when the PWB is put back. Performing the electrical continuity test takes a long time, especially if the PWB is part of a safety-critical system. For such a system, rigorous testing is required to ensure that electrical continuity was restored and to make sure that the correct software was installed in the flash memory.

Regarding the programming methods themselves, other methods typically do not partition memory into multiple groups. As a result, there is only one level of write-protection. By having only one level of write-protection, during programming, all nonvolatile memory is vulnerable to unintended changes. Another problem is that other methods used special-purpose equipment for programming. As a result, an end-user could not program memory on-site, and had to rely on outside vendors.

FIG. 1A is an illustration of a related embedded computing platform 102. The embedded computing platform 102 includes a removable flash memory 104 and a PWB 103. An outside vendor programs a new removable flash module 105 with a new software version, FIG. 1B is an illustration of the flash memory during programming 104. The PWB 103 is taken out of the embedded computing platform 102, and the original flash memory 104 is replaced with the new removable flash memory 105.

FIG. 1C is an illustration of testing embedded computing platform 102 after putting back the PWB 103 containing the new flash memory 105. After putting the PWB 103 containing the new flash memory 105 back into the embedded computing platform 102, an electrical continuity test checks if the PWB 103 has been reinstalled correctly. Another set of tests are performed on the flash memory 104 to verify that the software was installed properly.

In light of the foregoing, there is a need for a method of programming "non-removable" flash memory that does not require removal of the flash memory.

BRIEF SUMMARY

To solve the above and/or other problems, it is an aspect of the described embodiments to provide a method of programming a flash memory including partitioning a flash memory into a first group having a first level of write-protection, a second group having a second level of write-protection, and a third group having a third level of write-protection; disabling the write-protection of the second and third groups including using an installation adapter; and programming the second and third groups including using a Software Installation Device.

To solve the above and/or other problems, it is an aspect of the described embodiments to provide a method of programming a flash memory including partitioning a flash memory into a first group having a first level of write-protection, a second group having a second level of write-protection, and a third group having a third level of write-protection; disabling the write-protection of the second and third groups including using an installation adapter; programming the second and third groups including using a Software Installation Device; and performing an automatic installation check on the flash memory.

To solve the above and/or other problems, it is an aspect of the described embodiments to provide a flash memory including a first group having a first level of write-protection, a second group having a second level of write-protection, a third group having a third level of write-protection, and the levels of write-protection of the first, second, and third groups are different.

BRIEF DESCRIPTION OF THE SEVERAL VIEWS OF THE DRAWINGS

These or other aspects and advantages or both will become more readily appreciated from the following description of embodiments, taken in conjunction with the accompanying drawings in which.

DETAILED DESCRIPTION OF THE EMBODIMENTS

Figure 1A:
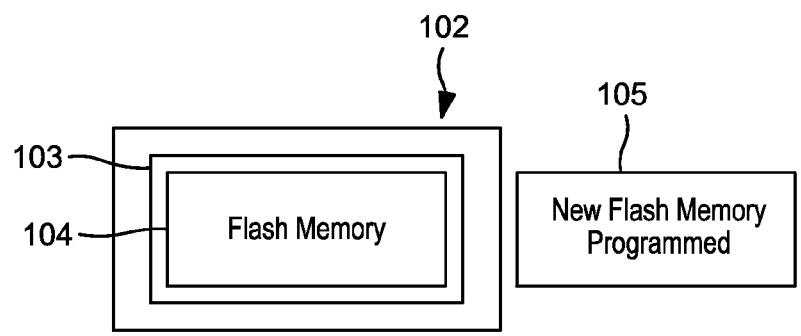
FIGS. 1A, 1B, and 1C are illustrations of a related flash memory during different stages of programming.
Figure 1B:
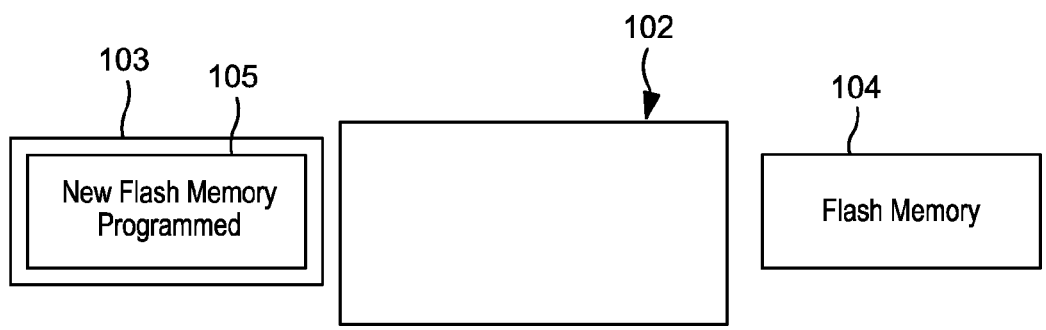

Embodiments are described below, examples of which are illustrated in the accompanying drawings, wherein like reference numerals refer to the like elements throughout. Although a few embodiments have been shown and described, those skilled in the art will appreciate that changes may be made in these embodiments without departing from the principles and spirit of the embodiments, the scope of which is defined in the appended claims and their equivalents.

Figure 2A:
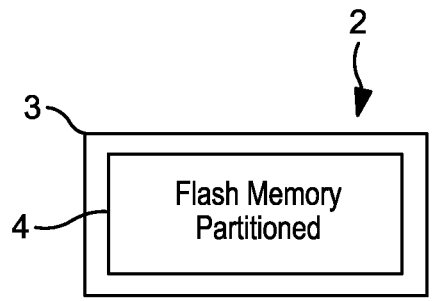
FIGS. 2A, 2B, and 2C are illustrations of a flash memory according to a present embodiment during different stages of programming.

FIG. 2A is an illustration of an embedded computing platform 2 according to a present embodiment. The embedded computing platform 2 includes a flash memory 4 and a PWB 3.

Figure 2B:
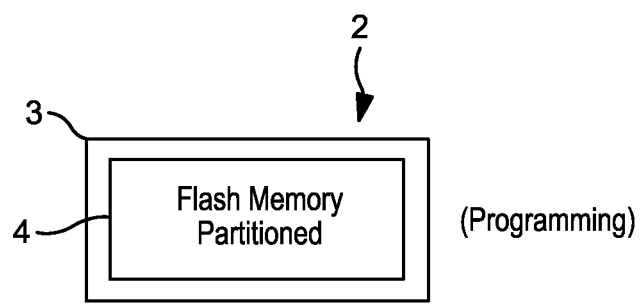

FIG. 2B is an illustration of the flash memory 4 during programming.

Figure 1C:
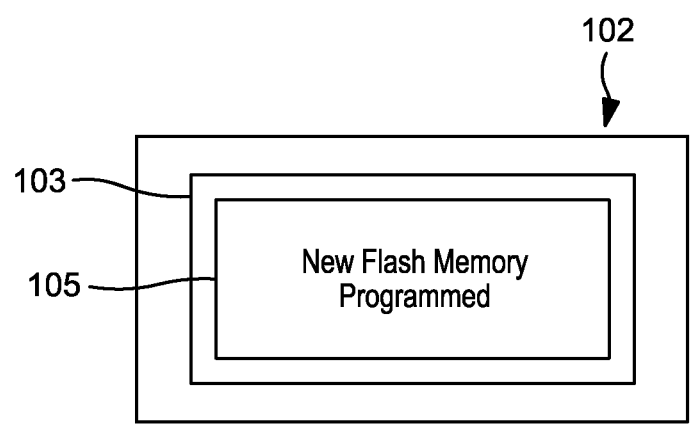
Figure 2C:
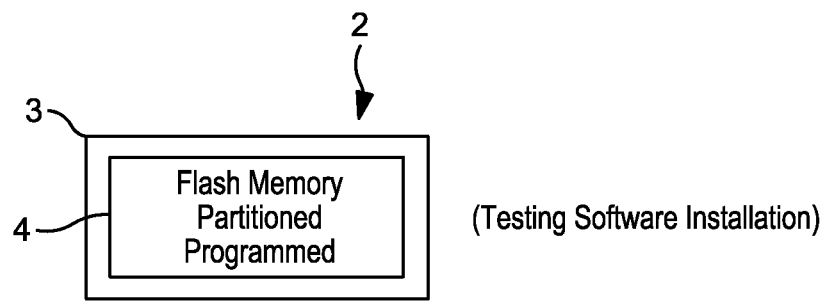

FIG. 2C is an illustration of testing performed after programming the flash memory 4. A software installation test is performed on the flash memory 4 to verify that the desired software was installed properly. No electrical continuity test is performed, unlike the related method as shown in FIG. 1C.

Figure 3:
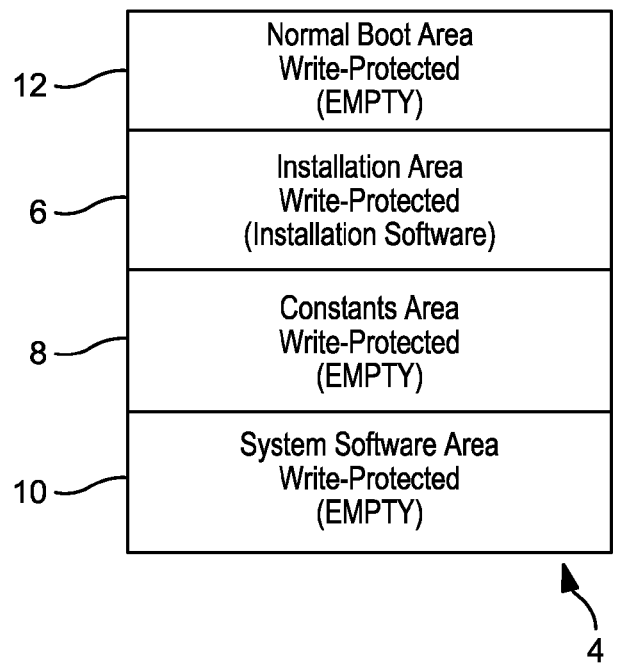
FIG. 3 is a more detailed illustration of the flash memory of FIGS. 2A-2C.

FIG. 3 is a more detailed illustration of the flash memory 4. The flash memory 4 is a non-removable memory and is partitioned into three types of memory groups: a permanent memory group 6, an alignable memory group 8, and immutable memory groups 10, 12. The groups 6, 8, 10, 12 have varying levels of write-protection. FIG. 3 shows the flash memory 4 before the initial installation of software constants and system software.

Figure 4:
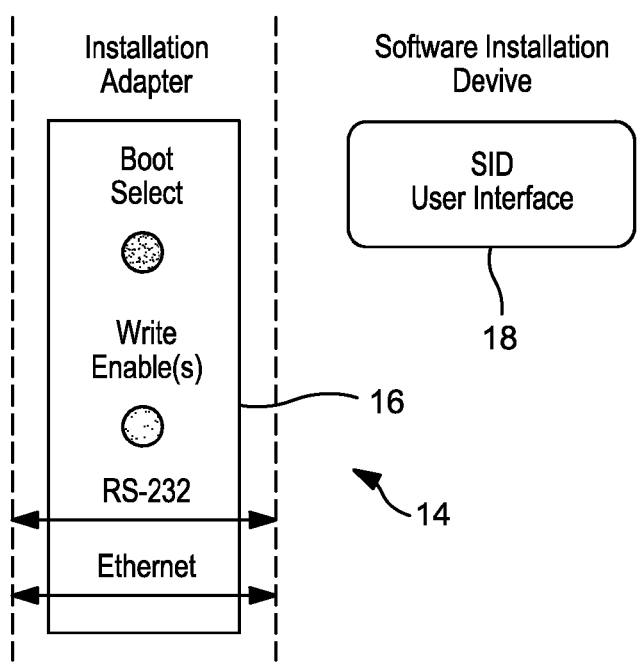
FIG. 4 is an illustration of a programming apparatus used to program the flash memory of FIG. 3.
Figure 5:
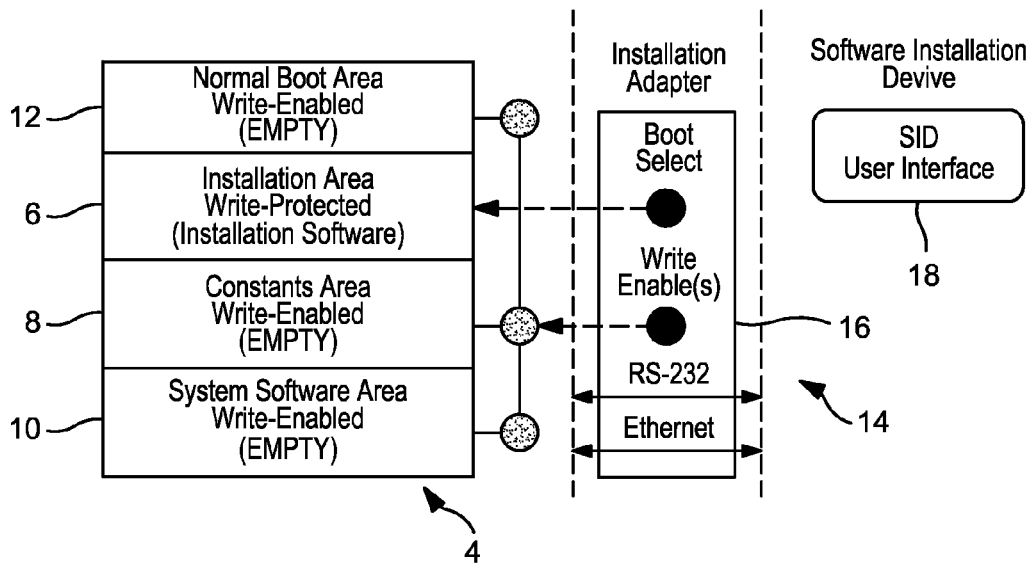
FIG. 5 is an illustration the interface between the flash memory and the programming apparatus of FIGS. 3 & 4.
Figure 6:
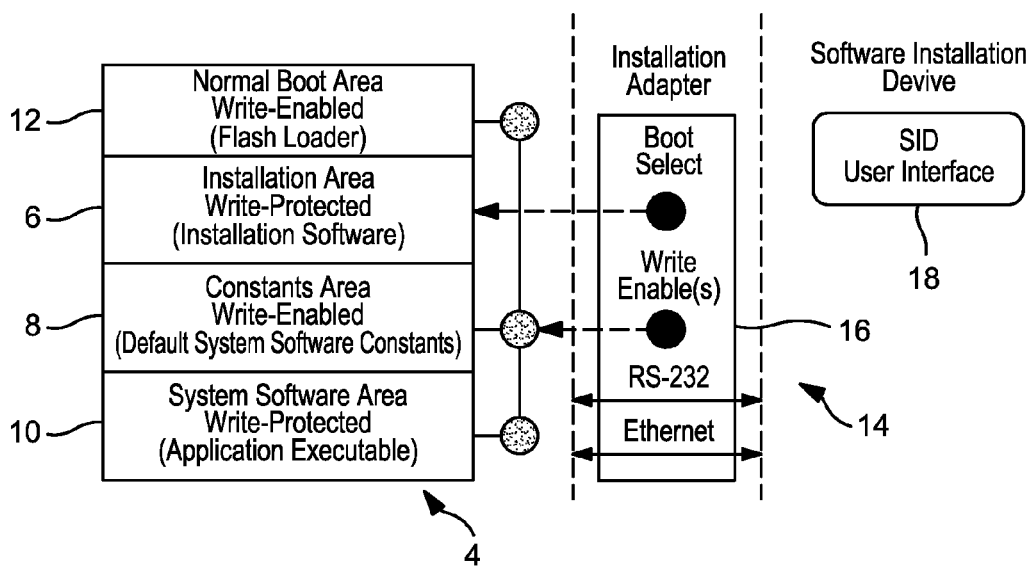
FIG. 6 is an illustration of the flash memory according to the embodiment of FIG. 3 after programming.
Figure 7:
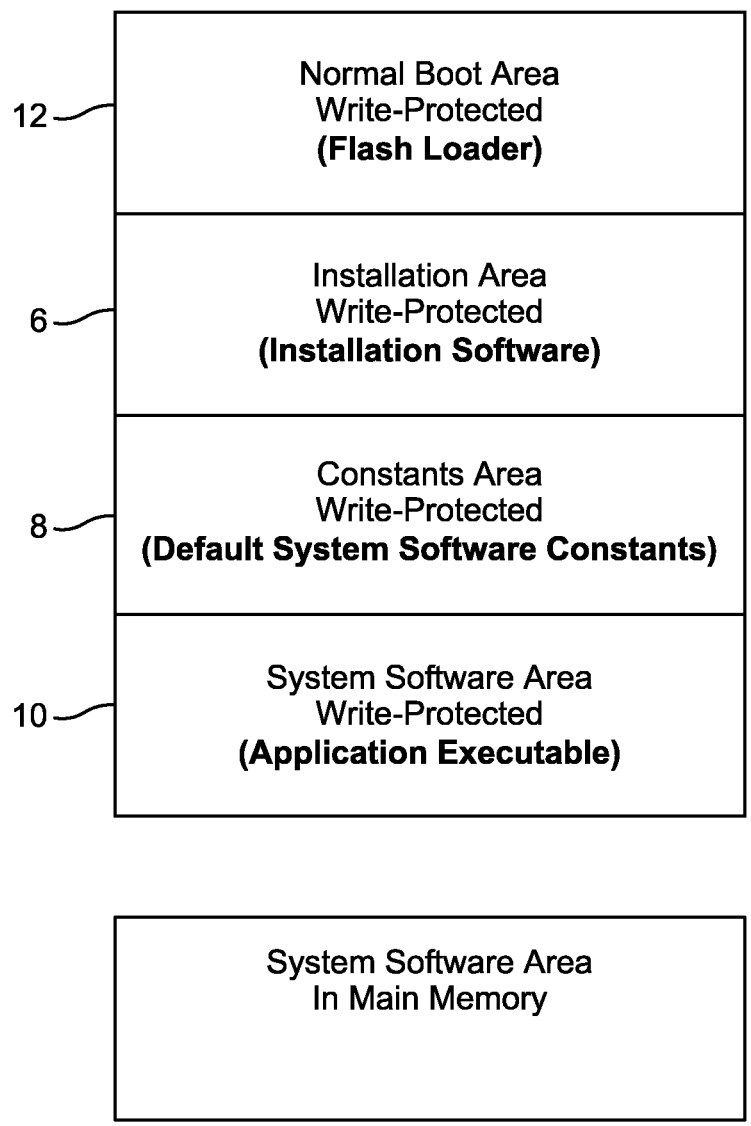
FIG. 7 is an illustration of the programmed flash memory of FIG. 3 after the SID and the installation adapter are removed.

The immutable memory group 10 has a system software area which stores installed programs. The immutable memory group 12 has a normal boot area as shown in FIGS. 3 and 7, which holds a flash loader program that loads the system software into main memory (not shown) and then transfers execution to the system software in main memory. Boots occur from the normal boot area when an installation adapter 16, as shown in FIG. 4, is not connected. Write-protection is normally enabled unless the installation adapter 16 is connected to the embedded computing platform 2 containing the flash memory 4 as shown in FIGS. 5 and 6.

The permanent memory group 6 includes an installation area which holds installation software. The installation software is used in programming the flash memory 4 and verifying that the software found in the immutable memory groups 10 and 12 and the alignable memory group 8 were installed properly. The installation software boots and operates independently of the system software. Boots occur from the installation area when an installation adapter 16 is attached to the embedded computing platform 2. The installation software functionality is minimal and should not require frequent changes. As a result, the permanent memory group 6 is designed so that end-users cannot write-enable the permanent memory group 6 and make changes to the installation software. Instead, the embedded computing platform manufacturer makes any changes to the permanent memory group 6.

The alignable memory group 8 includes a constants area which stores constants and data structures. Constants are used by the system software and the data structures may be used by the system software to access the constants. Write-protection for the alignable memory group 8 is independent of the write-protection for the permanent memory group 6 and the immutable memory groups 10, 12. Independent write-protection means that when the alignable memory group 8 is write-enabled, other memory groups 6, 10, 12 are not necessarily write-enabled.

FIG. 4 is an illustration of a programming apparatus 14 used to program the flash memory 4. The programming apparatus 14 includes the installation adapter 16, and a Software Installation Device (SID) 18.

The installation adapter 16 is a physical device that attaches to the embedded computing platform 2 and makes the alignable memory group 8 and immutable memory groups 10, 12 write-enabled. Attaching the installation adapter 16 sets a "boot select" signal on the embedded computing platform 2 so that the next boot will be from the permanent memory group 6 so that the installation software can be started and used to install the desired system software. The installation adapter 16 provides a way for the SID 18 to communicate with the installation software in order to program the flash memory 4. The installation adapter 16 has auxiliary connectors (e.g., RS-232 and Ethernet) that may be needed for communication and file transfers with the SID 18.

The SID 18 is a physical interface that is connected to the installation adapter 16. The SID 18 allows the end-user to control and monitor the software installation process. The SID 18 commands the installation software that is located in the permanent memory group 6. The SID may also be used to initialize the alignable memory group 8. As an example, the SID 18 can be a laptop computer or similar device.

FIG. 5 illustrates the interface between the flash memory 4 and the installation adapter 16 during programming. The installation adapter 16 is attached to the embedded computing platform 2, and the SID 18 is attached to the installation adapter 16. The installation adapter 16 makes the immutable 10, 12 and alignable 8 memory groups write-enabled. The installation adapter 16 uses the "boot select" to assert a signal on the embedded computing platform 2 so that the next boot will be from the permanent memory group 6 allowing the SID 18 to communicate with the installation software located in the permanent memory group 6.

FIG. 6 illustrates the interface between the flash memory 4 and the installation adapter 16 after programming. When the desired program is installed, the immutable memory group 12 includes a flash loader in the normal boot area. When the desired program is installed, the immutable memory group 10 will have the installed software in the system-software area. When the desired program is installed, the alignable memory group 8 will have the default system software constants installed.

After the desired flash loader, system software and application constants are installed, an automatic installation check is performed by the installation software to verify that the installation was successful. There are many methods of verifying installation success. As an example, one can use a two-part check including a message digest check and a bit-by-bit comparison.

The message digest check includes the computation of a message digest algorithm over the programmed immutable memory groups 10, 12 and the alignable memory group 8, and comparing the results to expected values that are provided along with the system software. A message digest algorithm produces a unique output for a particular set of input data (message), such that any two different sets of input data should not produce an equivalent output value. As an example, a Cyclic Redundancy Check (CRC) value may be generated to perform the message digest check.

A bit-by-bit comparison is performed by the SID 18 between a file with expected data and a file that the installation software uploads to the SID 18. The file that the installation software uploads to the SID 18 includes an image of the just-programmed immutable memory groups 10, 12 and alignable memory group 8.

After the automatic installation check, the installation adapter 16 may be removed, and the embedded computing platform 2 can be reset allowing a boot of the system software that was recently installed.

FIG. 7 illustrates the flash memory 4 after an automatic installation check as shown in FIG. 2C. When the automatic installation check confirms that the correct software was installed properly, then the SID 18 and the installation adapter 16 are removed. When the installation adapter 16 is removed, the alignable memory group 8 and the immutable memory groups 10, 12 return to being write-protected.

After the installation adapter 16 is removed from the embedded computing platform 2, a key code verification is performed. The key code verification includes computing a message digest algorithm over the immutable memory groups 10 and 12 by the system software. The output value of the message digest algorithm (the key code) is displayed by the normal monitoring device (not shown) of the embedded computing platform 2. The end-user compares the key code with an expected value that is provided with the embedded equipment technical manual. Key code verification is invalidated if the immutable memory groups 10, 12 are write-enabled.

Figure 8:
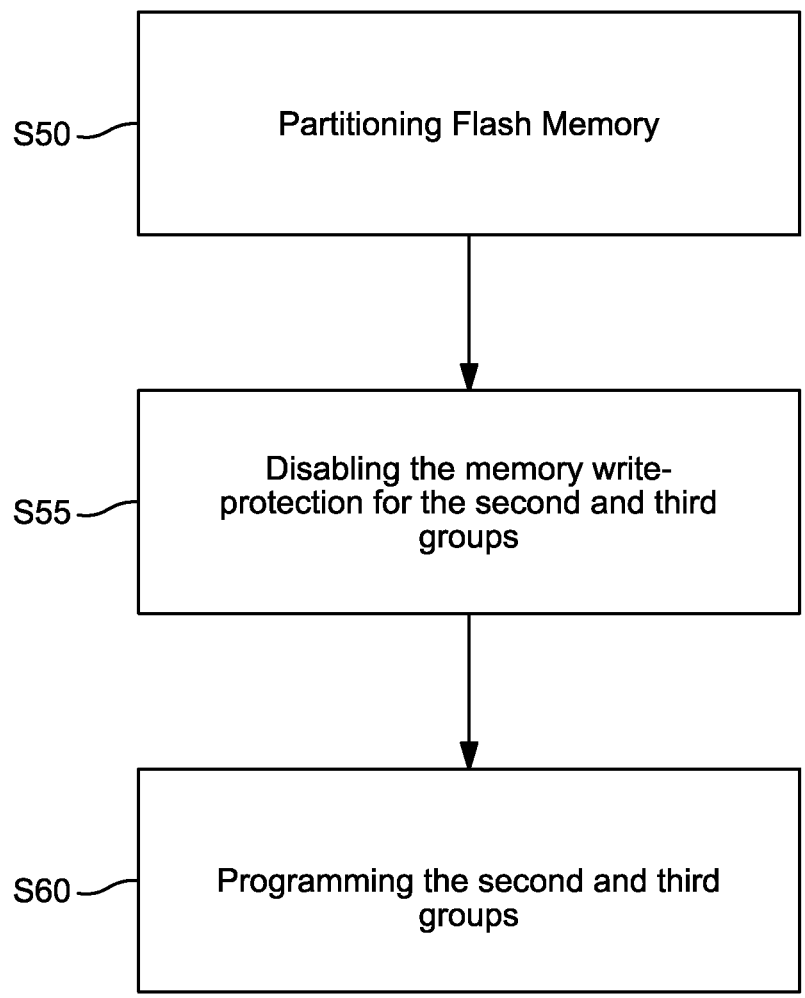
FIG. 8 is an illustration of a method of programming the flash memory according to a present embodiment.

FIG. 8 illustrates a method of programming the flash memory 4. Operation S50 includes partitioning the flash memory 4. This may include partitioning the flash memory 4 into the groups 6, 8, 10, and 12, as discussed above. The groups 6, 8, 10, and 12, as discussed above have different levels of write-protection. Operation S55 includes disabling the memory write-protection for the second and third groups (i.e, the immutable memory groups 8, 10, 12). This may be done with the installation adapter 16. Operation S60 includes programming the second and third groups. This may be done with the SID 18.

According to the foregoing, the method provides a way of programming flash memory without removing the memory. Thus, by using this method of programming flash memory, fewer tests are required to verify that programming was successful as compared to the related art, standardized hardware can be used to program the flash memory, and end-users can program the flash memory instead of relying on outside parties.

What is claimed is:

1. A method of programming, comprising:
  partitioning a flash memory in a computing platform into a first permanent memory group having a first level of write-protection, a second alignable memory group having a second level of write-protection, and a third immutable memory group having a third level of write-protection, wherein the levels of write-protection of the first, second, and third groups are different;
  disabling the write-protection of the second and third group using an external installation adapter; and
  programming the second and third group using a Software Installation Device.

2. The method of programming of claim 1, wherein the first group includes installation software.

3. A method of programming, comprising:
  partitioning a flash memory in a computing platform into a first permanent memory group having a first level of write-protection, a second alignable memory group having a second level of write-protection, and a third immutable memory group having a third level of write-protection, wherein the levels of write-protection of the first, second, and third groups are different;
  disabling the write-protection of the second and third groups using an external installation adapter;
  programming the second and third groups using a Software Installation Device; and
  performing an automatic installation check on the flash memory.

4. The method of programming of claim 3, wherein the first group includes installation software.

5. The method of programming of claim 4, wherein the performing of the automatic installation check comprises:
  performing a first check; and
  performing a second check.

6. The method of programming of claim 5, wherein:
  the performing of the first check comprises performing a Cyclic Redundancy Check; and
  the performing of the second check comprises performing a bit-by-bit comparison check.

7. A flash memory in a computing platform, comprising:
  a first permanent memory group having a first level of write-protection;
  a second alignable memory group having a second level of write-protection; and
  a third immutable memory group having a third level of write-protection,
  the levels of write-protection of the first, second, and third groups being different and configured to receive an external installation adapter configured to disable the write protection of the second and the third group.

* * * * *